United States Patent
Choi

(10) Patent No.: US 12,221,296 B2
(45) Date of Patent: Feb. 11, 2025

(54) SUBSTRATE PROCESSING APPARATUS AND METHOD

(71) Applicant: SEMES CO., LTD., Cheonan-si (KR)

(72) Inventor: Ho Chul Choi, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 18/458,252

(22) Filed: Aug. 30, 2023

(65) Prior Publication Data

US 2024/0092591 A1 Mar. 21, 2024

(30) Foreign Application Priority Data

Sep. 19, 2022 (KR) .................. 10-2022-0118192

(51) Int. Cl.
*B65G 49/06* (2006.01)
*B65G 47/91* (2006.01)
*H01L 21/677* (2006.01)

(52) U.S. Cl.
CPC ......... *B65G 49/065* (2013.01); *B65G 47/917* (2013.01); *H01L 21/67784* (2013.01)

(58) Field of Classification Search
CPC .... B65G 47/24; B65G 47/244; B65G 49/063; B65G 2207/06; B65G 49/065; B65G 47/917; H01L 21/67784
See application file for complete search history.

(56) References Cited

U.S. PATENT DOCUMENTS

| | | | | |
|---|---|---|---|---|
| 5,201,560 | A * | 4/1993 | Golden | B65G 47/91 417/187 |
| 10,433,434 | B2 * | 10/2019 | Vronsky | B05D 5/12 |
| 11,123,983 | B2 * | 9/2021 | Alamdar | B41J 11/0085 |
| 2018/0315633 | A1 * | 11/2018 | Shimizu | H01L 21/67259 |
| 2019/0193200 | A1 * | 6/2019 | Fuji | B23K 26/702 |
| 2021/0362273 | A1 * | 11/2021 | Suzuki | H01L 21/6776 |
| 2022/0152733 | A1 * | 5/2022 | Shimoji | B23K 26/082 |
| 2022/0190245 | A1 * | 6/2022 | Nguyen | B05D 1/26 |

FOREIGN PATENT DOCUMENTS

| | | | | |
|---|---|---|---|---|
| JP | 2006237482 A * | 9/2006 | | A61H 23/0218 |
| KR | 10-2006-0095504 | 8/2006 | | |
| KR | 10-2011-0032673 A | 3/2011 | | |

(Continued)

OTHER PUBLICATIONS

Office Action for Korean Application No. 10-2022-0118192 dated Mar. 14, 2024.

*Primary Examiner* — Gregory W Adams
(74) *Attorney, Agent, or Firm* — Harness, Dickey & Pierce, P.L.C.

(57) ABSTRACT

Provided is a substrate processing apparatus and method capable of controlling a gripper to stably suck a substrate even when the substrate is deformed, the substrate processing apparatus including a floating stage for floating a substrate, lift pins liftably mounted in the floating stage, a substrate aligner for aligning the substrate floated from the floating stage, a gripper for vacuum-sucking the aligned substrate, and a controller capable of controlling a floating height of the substrate, wherein the controller reduces the floating height of the substrate when the gripper fails to vacuum-suck the substrate.

20 Claims, 13 Drawing Sheets

(56) References Cited

FOREIGN PATENT DOCUMENTS

| | | | | |
|---|---|---|---|---|
| KR | 20110081494 A | * | 7/2011 | ....... H01L 21/68714 |
| KR | 10-2012-0103487 A | | 9/2012 | |
| KR | 10-2015-0070702 A | | 6/2015 | |
| KR | 10-2016-0080481 | | 7/2016 | |
| WO | WO-2020208862 A1 | * | 10/2020 | ......... B23K 26/0732 |

* cited by examiner

SUBSTRATE PROCESSING APPARATUS AND METHOD

CROSS-REFERENCE TO RELATED PATENT APPLICATION

This application claims the benefit of Korean Patent Application No. 10-2022-0118192, filed on Sep. 19, 2022, in the Korean Intellectual Property Office, the disclosure of which is incorporated herein in its entirety by reference.

BACKGROUND OF THE INVENTION

1. Field of the Invention

The present invention relates to a substrate processing apparatus and method and, more particularly, to a substrate processing apparatus and method capable of controlling a gripper to stably suck a substrate even when the substrate is deformed.

2. Description of the Related Art

In general, an existing substrate processing apparatus for performing a printing process by ejecting a treatment liquid onto an upper surface of a substrate while the substrate is floated using a floating stage to protect a lower surface of the substrate may float the substrate by emitting a gas through emission holes of the floating stage when the substrate is seated on lift pins, align the substrate by using a substrate aligner, suck at least a portion of the substrate by using a gripper, and then transfer or print the substrate while the other portion of the substrate is floated.

However, according to the existing substrate processing apparatus, when the substrate is deformed, although a vacuum pressure is formed by the gripper, a probability that the substrate is out of position, the vacuum pressure is not sufficiently transmitted to the substrate, and thus the gripper fails in vacuum suction is about 10% which is a quite high value.

Therefore, when the gripper fails in vacuum suction, an alarm signal may be generated to pause operation of equipment and thus many problems such as a severe decrease in productivity of the equipment may occur.

SUMMARY OF THE INVENTION

The present invention provides a substrate processing apparatus and method capable of greatly increasing productivity of equipment by using a controller and control process for controlling a gripper to always suck a substrate stably even when the substrate is deformed. However, the above description is an example, and the scope of the present invention is not limited thereto.

According to an aspect of the present invention, there is provided a substrate processing apparatus including a floating stage for floating a substrate, lift pins liftably mounted in the floating stage, a substrate aligner for aligning the substrate floated from the floating stage, a gripper for vacuum-sucking the aligned substrate, and a controller capable of controlling a floating height of the substrate, wherein the controller reduces the floating height of the substrate when the gripper fails to vacuum-suck the substrate.

The controller may include a lift pin up controller for lifting the lift pins to a first pin height to seat the substrate on the lift pins, a primary floating height controller for controlling a floating height of the floating stage to float the substrate to a first floating height by using the floating stage when the lift pins are lowered to a second pin height, an alignment controller for controlling the substrate aligner to align the substrate floated to the first floating height, a vacuum suction controller for controlling the gripper to vacuum-suck the aligned substrate, and a lift pin down controller for lowering the lift pins into the floating stage when the gripper succeeds in vacuum suction.

The controller may further include a secondary floating height controller for controlling the floating height of the floating stage to lower the substrate to a second floating height lower than the first floating height by using the floating stage if the gripper fails in primary vacuum suction.

The controller may further include a tertiary floating height controller for controlling the floating height of the floating stage to lower the substrate to a third floating height lower than the second floating height by using the floating stage if the gripper fails in secondary vacuum suction.

The controller may further include a height restoration controller for restoring the floating height of the floating stage to restore the substrate to the first floating height by using the floating stage if the gripper succeeds in secondary vacuum suction.

The controller may further include a valve closing controller for closing a flow control valve of the floating stage such that the substrate is in contact with the gripper without being floated, if the gripper fails in tertiary vacuum suction.

The controller may further include an automatic floating height controller for measuring an amount of deformation of the substrate by using a substrate deformation measurer if the gripper fails in primary vacuum suction, and automatically controlling the floating height of the floating stage to lower the substrate to an automatic floating height lower than the first floating height by using the floating stage based on the amount of deformation.

The substrate processing apparatus may further include a treatment liquid ejector for ejecting a treatment liquid onto the substrate, at least a portion of which is vacuum-sucked by the gripper and at least another portion of which is floated by the floating stage.

The floating stage may include a loading stage for loading the substrate, floating the substrate to a transfer height, and transferring the substrate in a first direction, and a printing stage for floating the substrate to a printing height to allow the treatment liquid ejector to eject the treatment liquid while moving in a second direction.

The loading stage may include a plurality of gas emission holes connected to a gas supply line, and the printing stage may include a plurality of gas emission holes connected to the gas supply line and a plurality of gas suction holes connected to a gas suction line.

The controller may adjust a gas supply pressure by controlling a flow control valve of the gas supply line or the gas suction line.

The floating stage may further include an unloading stage for floating the substrate to a transfer height, transferring the substrate in the first direction, and unloading the substrate.

The substrate processing apparatus may further include a substrate deformation measurer for measuring an amount of deformation of the substrate and applying information about the amount of deformation to the controller.

The gripper may be transferred along transfer rails provided along the floating stage.

According to another aspect of the present invention, there is provided a substrate processing method including (a) lifting lift pins to a first pin height to seat a substrate on the lift pins, (b) floating the substrate to a first floating height by using a floating stage when the lift pins are lowered to the second pin height, (c) aligning the substrate floated to the first floating height, by using a substrate aligner, (d) vacuum-sucking the aligned substrate by using a gripper, (e) lowering the lift pins into the floating stage when the gripper succeeds in vacuum suction, and (f) controlling a floating height of the floating stage to lower the substrate to a second floating height lower than the first floating height by using the floating stage if the gripper fails in primary vacuum suction.

The substrate processing method may further include, after step (f), (g) controlling the floating height of the floating stage to lower the substrate to a third floating height lower than the second floating height by using the floating stage if the gripper fails in secondary vacuum suction.

The substrate processing method may further include, after step (f), (h) restoring the floating height of the floating stage to restore the substrate to the first floating height by using the floating stage if the gripper succeeds in secondary vacuum suction.

The substrate processing method may further include, after step (g), (i) closing a flow control valve of the floating stage such that the substrate is in contact with the gripper without being floated, if the gripper fails in tertiary vacuum suction.

Step (f) may include (j) measuring an amount of deformation of the substrate by using a substrate deformation measurer if the gripper fails in vacuum suction, and automatically controlling the floating height of the floating stage to lower the substrate to an automatic floating height lower than the first floating height by using the floating stage based on the amount of deformation.

According to another aspect of the present invention, there is provided a substrate processing apparatus including a floating stage for floating a substrate, lift pins liftably mounted in the floating stage, a substrate aligner for aligning the substrate floated from the floating stage, a gripper for vacuum-sucking the aligned substrate, a treatment liquid ejector for ejecting a treatment liquid onto the substrate, and a controller capable of controlling a floating height of the substrate, wherein, to reduce the floating height of the substrate when the gripper fails to vacuum-suck the substrate, the controller includes a lift pin up controller for lifting the lift pins to a first pin height to seat the substrate on the lift pins, a primary floating height controller for controlling a floating height of the floating stage to float the substrate to a first floating height by using the floating stage when the lift pins are lowered to a second pin height, an alignment controller for controlling the substrate aligner to align the substrate floated to the first floating height, a vacuum suction controller for controlling the gripper to vacuum-suck the aligned substrate, a lift pin down controller for lowering the lift pins into the floating stage when the gripper succeeds in vacuum suction, and a secondary floating height controller for controlling the floating height of the floating stage to lower the substrate to a second floating height lower than the first floating height by using the floating stage if the gripper fails in primary vacuum suction.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
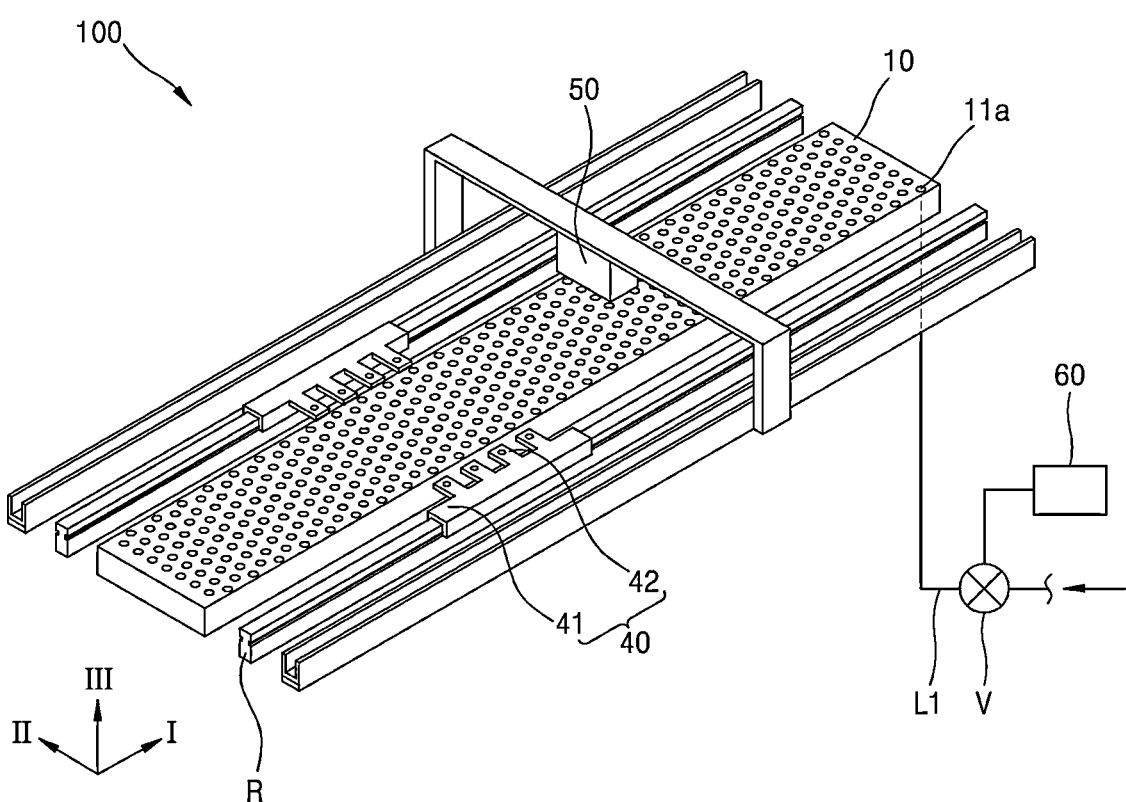
FIG. 1 is a perspective view of a substrate processing apparatus according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
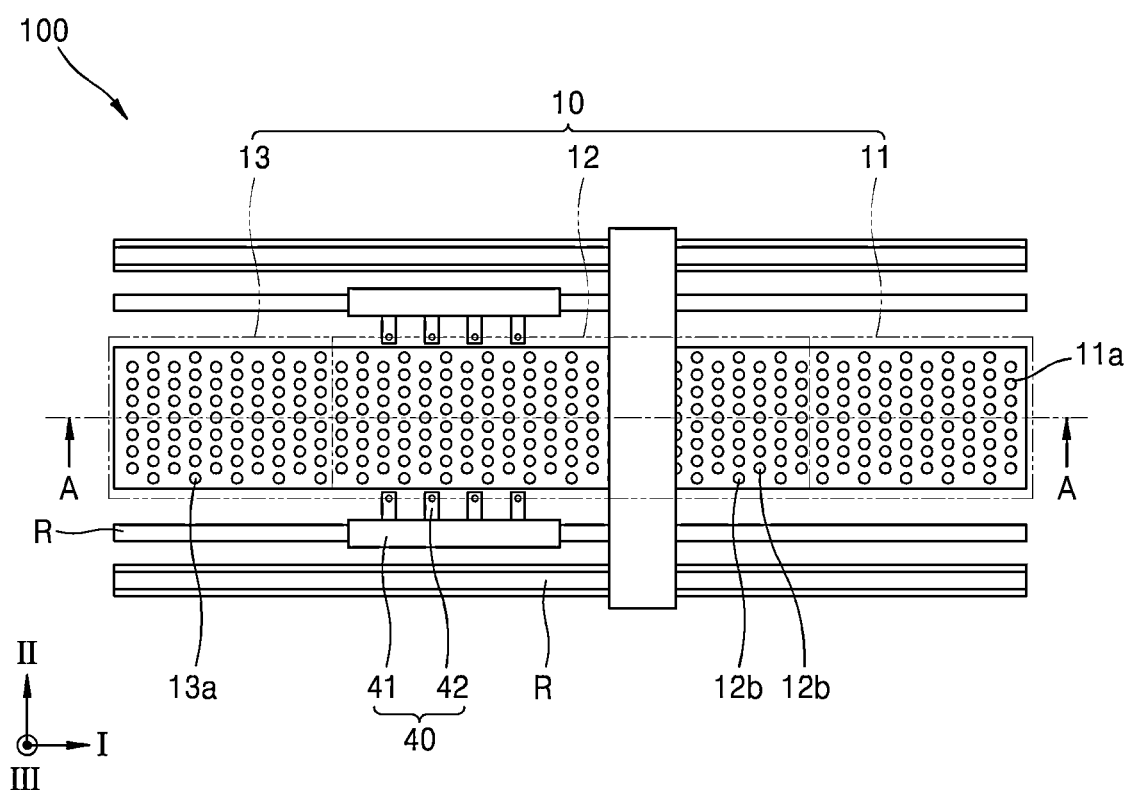
FIG. 2 is a plan view of the substrate processing apparatus of FIG. 1.
Figure 3:
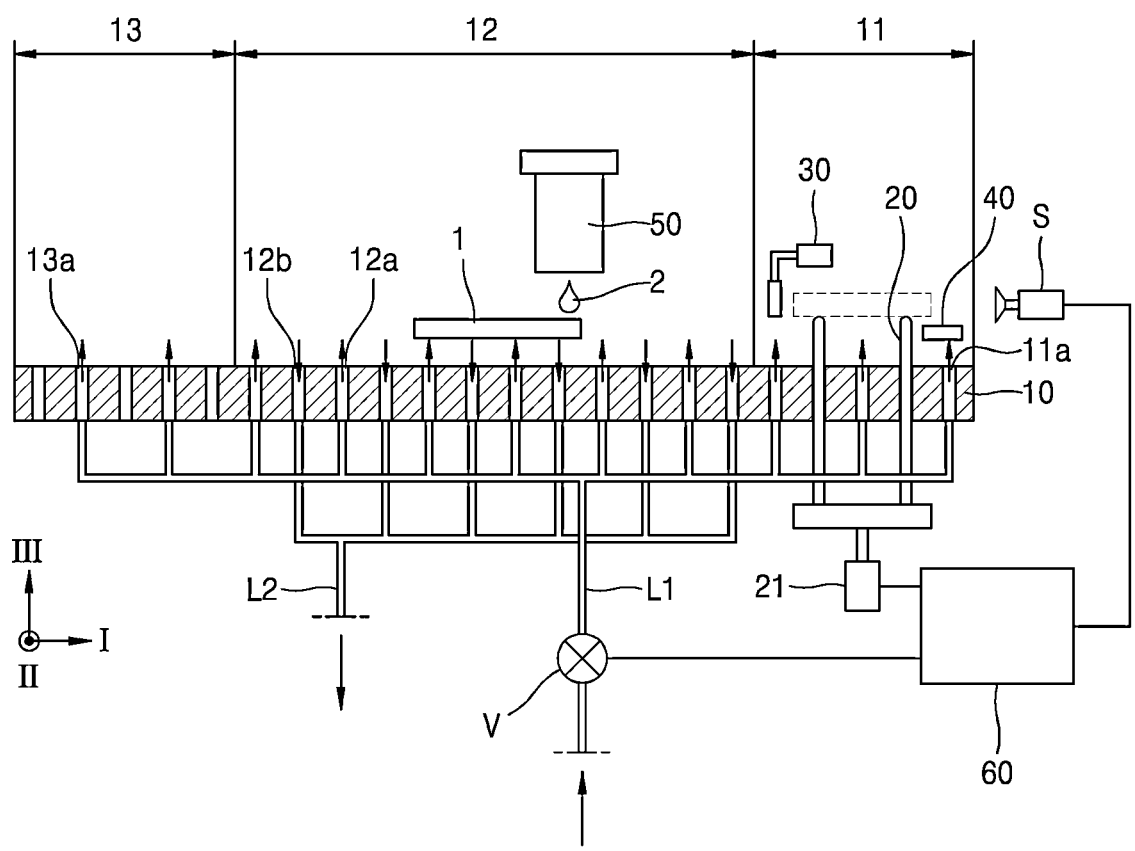
FIG. 3 is a cross-sectional view of the substrate processing apparatus of FIG. 1

FIG. 1 is a perspective view of a substrate processing apparatus 100 according to some embodiments of the present invention, FIG. 2 is a plan view of the substrate processing apparatus 100 of FIG. 1, and FIG. 3 is a cross-sectional view of the substrate processing apparatus 100 of FIG. 1.

Initially, as shown in FIGS. 1 to 3, the substrate processing apparatus 100 according to some embodiments of the present invention may mainly include a floating stage 10, lift pins 20, a substrate aligner 30, a gripper 40, a treatment liquid ejector 50, and a controller 60.

For example, the floating stage 10 may be a kind of air plate that floats the substrate 1 to protect a lower surface of the substrate 1, which is at least partially processed, while the substrate 1 is being transferred.

As shown in FIGS. 2 and 3, the floating stage 10 may include a loading stage 11 for loading the substrate 1, floating the substrate 1 to a transfer height, and transferring the substrate 1 in a first direction I, a printing stage 12 for floating the substrate 1 to a printing height to allow the treatment liquid ejector 50 to eject a treatment liquid 2 while moving in the first direction I or a second direction II, and an unloading stage 13 for floating the substrate 1 to a transfer height, transferring the substrate 1 in the first direction I, and unloading the substrate 1.

However, the loading stage 11, the printing stage 12, and the unloading stage 13 are not limited to the illustration and a wide variety of stages are all applicable. For example, the loading stage 11 may serve as the unloading stage 13, or the loading stage 11, the printing stage 12, and the unloading stage 13 may be provided in one body.

Specifically, for example, as shown in FIG. 3, the loading stage 11 may include a plurality of gas emission holes 11a connected to a gas supply line L1 to float and safely transfer the substrate 1 while protecting a rear surface of the substrate 1.

The printing stage 12 may include a plurality of gas emission holes 12a connected to the gas supply line L1 to minimize deformation of the substrate 1 and maintain the substrate 1 at a certain floating height, and a plurality of gas suction holes 12b connected to a gas suction line L2.

The unloading stage 13 may include a plurality of gas emission holes 13a connected to the gas supply line L1 to float and safely unload the substrate 1 while protecting the rear surface of the substrate 1.

Therefore, the substrate 1 may be floated and loaded onto the printing stage 12 while the rear surface of the substrate 1 is safely protected, by the plurality of gas emission holes 11a in the loading stage 11, printed while being maintained at the certain floating height, by the plurality of gas emission holes 12a and the plurality of gas suction holes 12b in the printing stage 12, and then floated and safely unloaded to the outside by the plurality of gas emission holes 13a after the printing process.

For example, as shown in FIG. 3, the lift pins 20 may be pin-type structures liftably mounted in the loading stage 11 of the floating stage 10 to receive the substrate 1 from a transfer robot when the substrate 1 is loaded onto the floating stage 10.

The lift pins 20 may be lifted by a lift pin lifter 21 mounted in the floating stage 10. The lift pins 20 may be lifted to support the substrate 1 when the substrate 1 is loaded, or lowered into the floating stage 10 so as not to interfere with the substrate 1 when the substrate 1 is transferred.

For example, as shown in FIG. 3, the substrate aligner 30 is a device for aligning a position of the substrate 1 before the substrate 1 is vacuum-sucked by the gripper 40, and may align the substrate 1 in place, for example, by pressing side surfaces of the substrate 1 freely floated from the lift pins 20 by the plurality of gas emission holes 11a in the loading stage 11 of the floating stage 10.

The substrate aligner 30 may align the substrate 1 by using side aligners or the like driven by various types of cylinders, motors, or actuators, but is not limited to the illustration, and a wide variety of aligners are all applicable.

For example, as shown in FIGS. 1 to 3, the gripper 40 is a device for vacuum-sucking the aligned substrate 1, and may be transferred in the first direction I along transfer rails R provided along the floating stage 10.

Specifically, for example, the gripper 40 may include gripper moving parts 41 corresponding to the transfer rails R, and gripper suction parts 42 extending from the gripper moving parts 41 toward the substrate 1 to correspond to the substrate 1 and to vacuum-suck the substrate 1 having vacuum suction holes.

Therefore, the gripper suction parts 42 may vacuum-suck both side edges of the lower surface of the substrate 1 and be transferred in the first direction I along the transfer rails R.

For example, as shown in FIGS. 1 and 3, the treatment liquid ejector 50 is a device for ejecting the treatment liquid 2 such as ink onto the substrate 1 in an inkjet manner, and may include red (R), green (G), and blue (B) heads for ejecting the treatment liquid 2 onto the substrate 1 while moving in the first or second direction I or II.

Therefore, the treatment liquid ejector 50 may eject the treatment liquid 2 onto the substrate 1, at least a portion of which is vacuum-sucked by the gripper 40 and at least another portion of which is floated by the floating stage 10.

Figure 4:
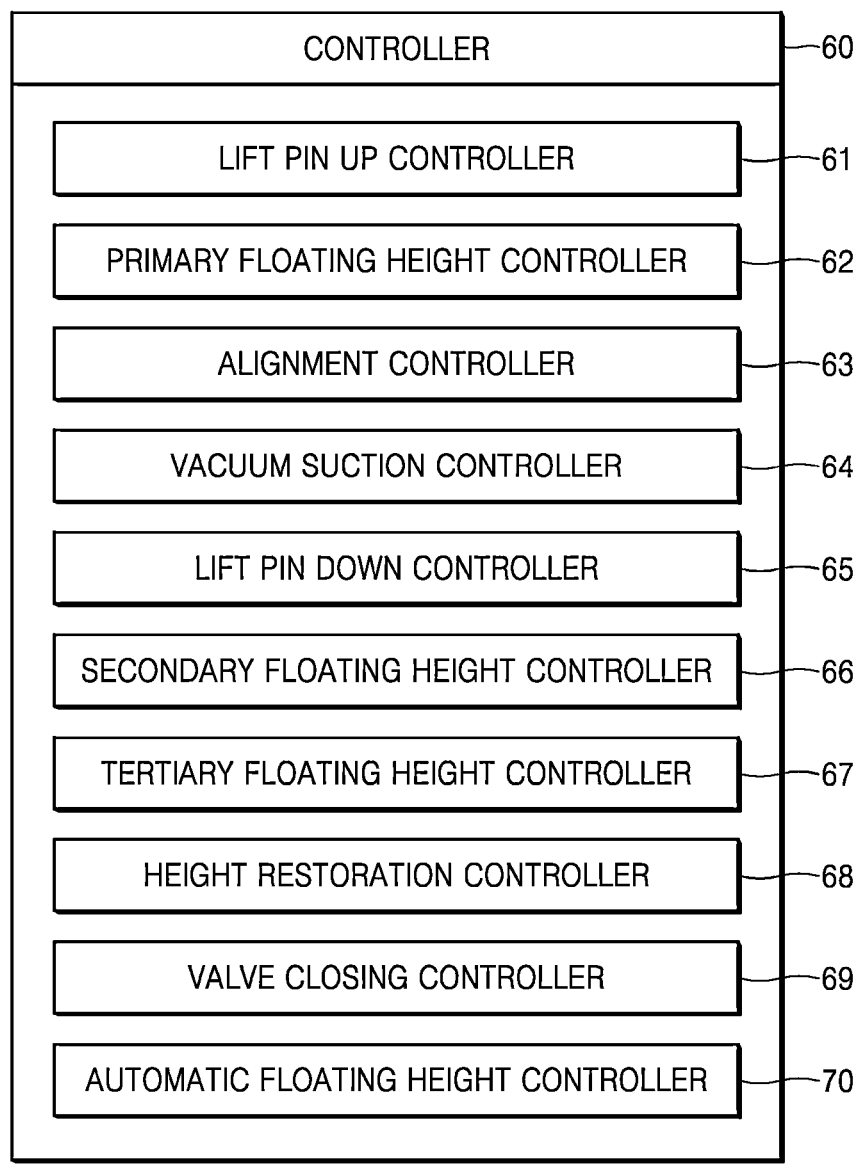
FIG. 4 is a block diagram of a controller of the substrate processing apparatus of FIG. 1.

FIG. 4 is a block diagram of the controller 60 of the substrate processing apparatus 100 of FIG. 1, and FIGS. 5 to 10 are cross-sectional views showing a gripper suction procedure of the substrate processing apparatus 100 of FIG. 1 step by step.

As shown in FIGS. 1 to 4, the controller 60 of the substrate processing apparatus 100 according to some embodiments of the present invention may include various electronic controllers capable of controlling a floating height of the substrate 1, e.g., control circuits, arithmetic logic units, central processing units, circuit boards, electronic components, control panels, controllers, microprocessors, semiconductor chips, integrated circuits, personal computers, information communication terminals, server computers, smartphones, smart pads, smart devices, memories, program-recorded storage devices, and electronic components.

For example, when the gripper 40 fails to vacuum-suck the substrate 1, the controller 60 may adjust a gas supply pressure by controlling a flow control valve V of the gas supply line L1 or the gas suction line L2 to reduce the floating height of the substrate 1.

Herein, the flow control valve V of the gas supply line L1 or the gas suction line L2 may be controlled in various manners, e.g., by adjusting a frequency (i.e., hertz (Hz)) of a control signal to be applied.

Specifically, for example, as shown in FIGS. 4 to 10, the controller 60 may include a lift pin up controller 61 for lifting the lift pins 20 to a first pin height P1 to seat the substrate 1 on the lift pins 20, a primary floating height controller 62 for controlling a floating height of the floating stage 10 to float the substrate 1 to a first floating height H1 by using the floating stage 10 when the lift pins 20 are lowered to a second pin height P2, an alignment controller 63 for controlling the substrate aligner 30 to align the substrate 1 floated to the first floating height H1, a vacuum suction controller 64 for controlling the gripper 40 to vacuum-suck the aligned substrate 1, and a lift pin down controller 65 for lowering the lift pins 20 into the floating stage 10 when the gripper 40 succeeds in vacuum suction.

For example, as shown in FIGS. 4 to 10, in order for the gripper 40 to re-attempt vacuum suction without stopping equipment operation even when the gripper 40 fails to vacuum-suck the substrate 1 due to deformation of the substrate 1, the controller 60 may further include a secondary floating height controller 66 for controlling the floating height of the floating stage 10 to lower the substrate 1 to a second floating height H2 lower than the first floating height H1 by using the floating stage 10 if the gripper 40 fails in primary vacuum suction, a tertiary floating height controller 67 for controlling the floating height of the floating stage 10 to further lower the substrate 1 to a third floating height H3 lower than the second floating height H2 by using the floating stage 10 if the gripper 40 fails in secondary vacuum suction, and a height restoration controller 68 for restoring the floating height of the floating stage 10 to restore the substrate 1 to the first floating height H1 by using the floating stage 10 if the gripper 40 succeeds in secondary vacuum suction.

Therefore, when vacuum suction fails, for example, when a sufficient vacuum pressure is not formed in vacuum holes, the gripper 40 may automatically attempt to vacuum-suck the substrate 1 several times until vacuum suction is successful by gradually lowering the substrate 1 to the first floating height H1, the second floating height H2, and the third floating height H3 by using the floating stage 10.

Meanwhile, as shown in FIGS. 4 to 10, the controller 60 of the substrate processing apparatus 100 according to some embodiments of the present invention may further include a valve closing controller 69 for closing the flow control valve V of the floating stage 10 such that the substrate 1 is in contact with the gripper 40 without being floated, if the gripper 40 fails in tertiary vacuum suction.

Regardless of the number of vacuum suction attempts by the gripper 40, when the gripper 40 fails in vacuum suction, the valve closing controller 69 may close the flow control valve V of the floating stage 10 after the last attempt to ensure 100% success in suction, or immediately after vacuum suction fails.

Meanwhile, as shown in FIG. 3, the substrate processing apparatus 100 according to some embodiments of the present invention may further include a substrate deformation measurer S for measuring an amount of deformation of the substrate 1 and applying information about the amount of deformation to the controller 60.

In this case, the controller 60 may further include an automatic floating height controller 70 for measuring the amount of deformation of the substrate 1 by using the substrate deformation measurer S if the gripper 40 fails in primary vacuum suction, and automatically controlling the floating height of the floating stage 10 to immediately lower the substrate 1 to an automatic floating height lower than the first floating height H1, i.e., one of the second and third floating heights H2 and H3, by using the floating stage 10 based on the amount of deformation.

Accordingly, an equipment downtime and an error correction time may be greatly reduced using the controller 60 and control process for controlling the gripper 40 to always suck the substrate 1 stably even when the substrate 1 is deformed, and thus productivity of equipment may be greatly increased.

FIGS. 5 to 10 are cross-sectional views showing a gripper suction procedure of the substrate processing apparatus 100 of FIG. 1 step by step.

Figure 5:
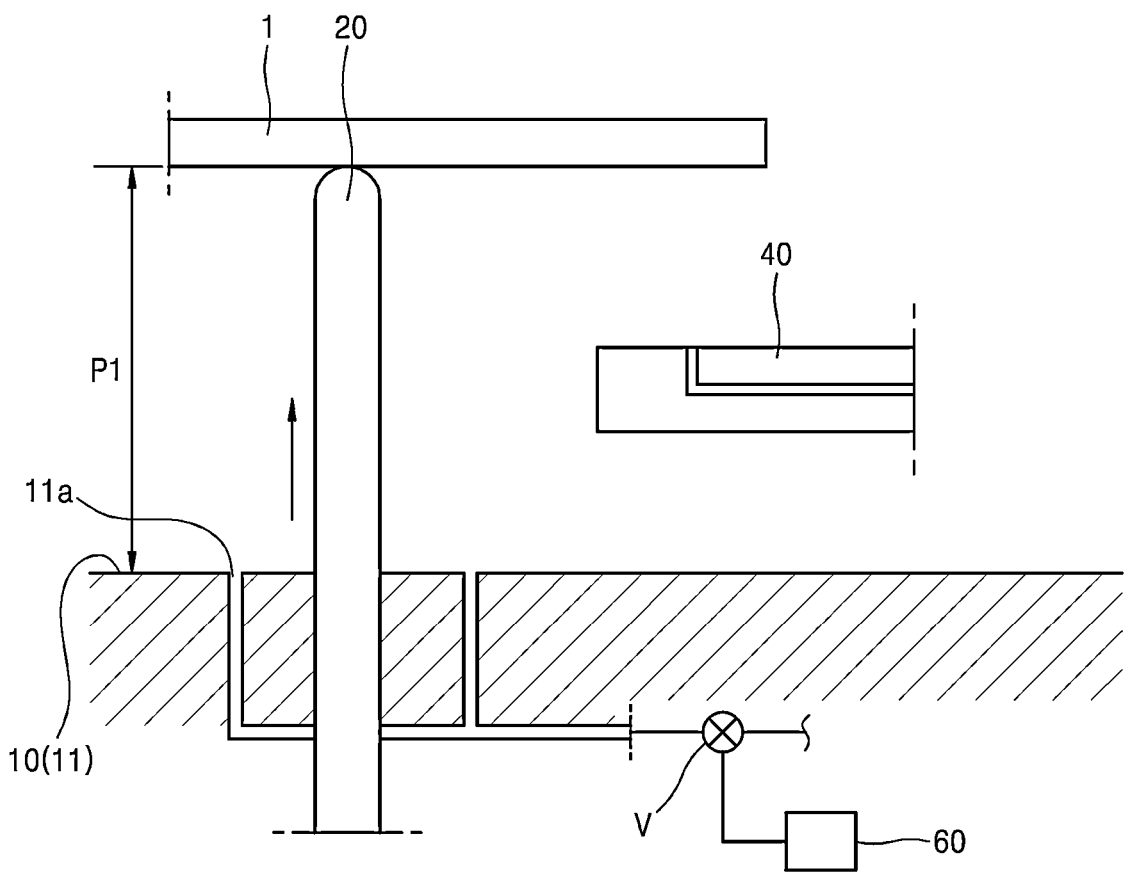
FIGS. 5 to 10 are cross-sectional views showing a gripper suction procedure of the substrate processing apparatus of FIG. 1 step by step.

The gripper suction procedure of the substrate processing apparatus 100 according to some embodiments of the present invention will now be described step by step with reference to FIGS. 5 to 10. Initially, as shown in FIG. 5, the lift pins 20 may be lifted to the first pin height P1 to seat the substrate 1 on the lift pins 20.

Figure 6:
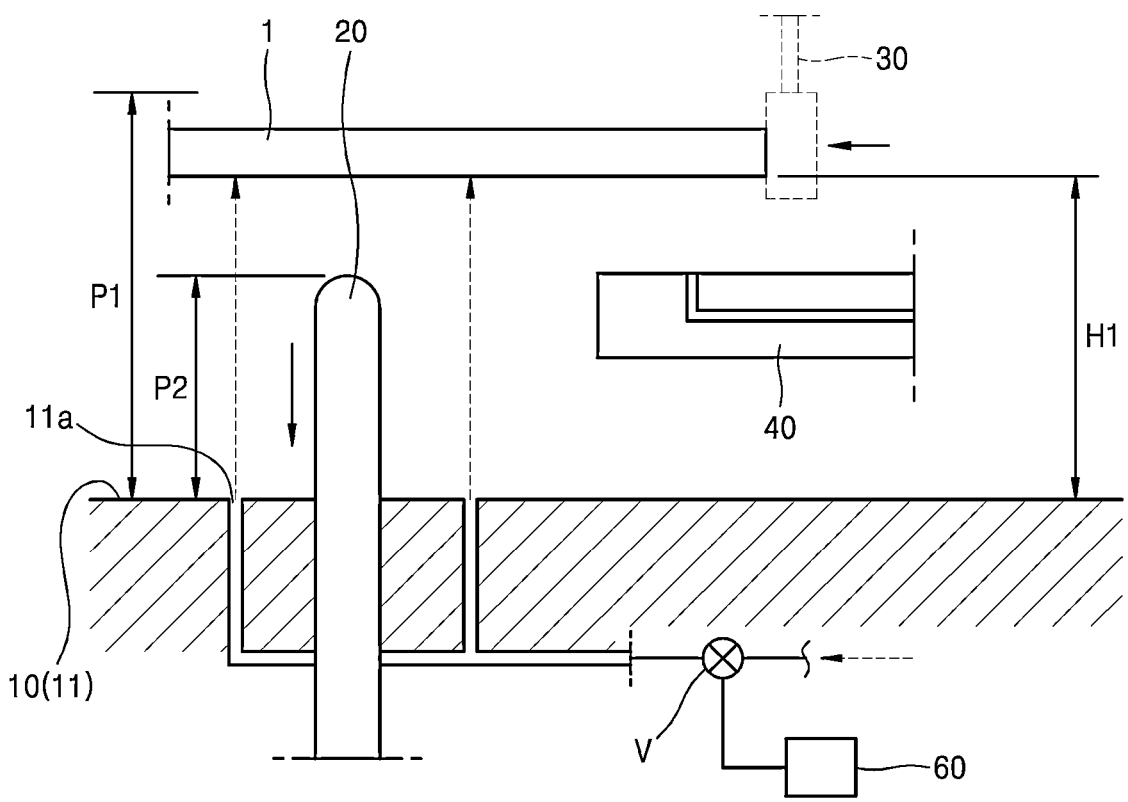

Then, as shown in FIG. 6, when the lift pins 20 are lowered to the second pin height P2, the substrate 1 may be floated to the first floating height H1 by using the floating stage 10, and the substrate aligner 30 may laterally press the substrate 1 to align the substrate 1 floated to the first floating height H1 in place.

Figure 7:
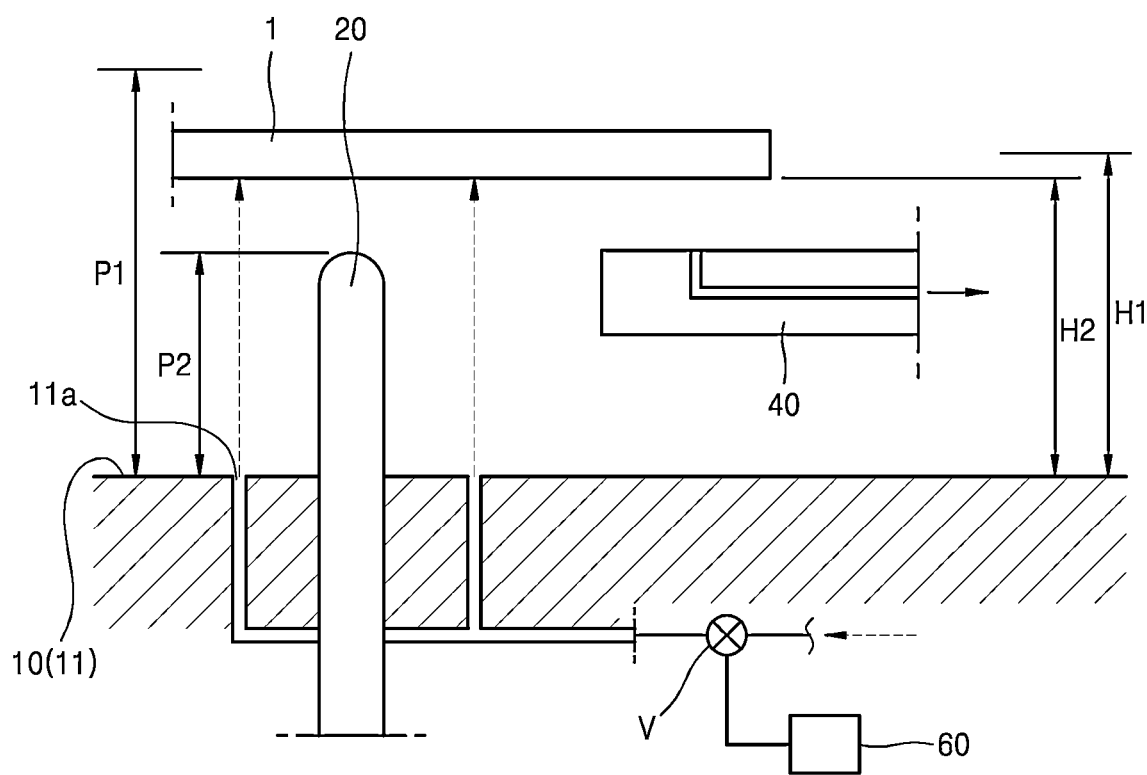

Then, as shown in FIG. 7, the gripper 40 may attempt to vacuum-suck the aligned substrate 1 by applying a vacuum pressure to vacuum holes of the gripper 40.

If the gripper 40 fails in primary vacuum suction, the floating height of the floating stage 10 may be controlled to lower the substrate 1 to the second floating height H2 lower than the first floating height H1 by using the floating stage 10.

Figure 8:
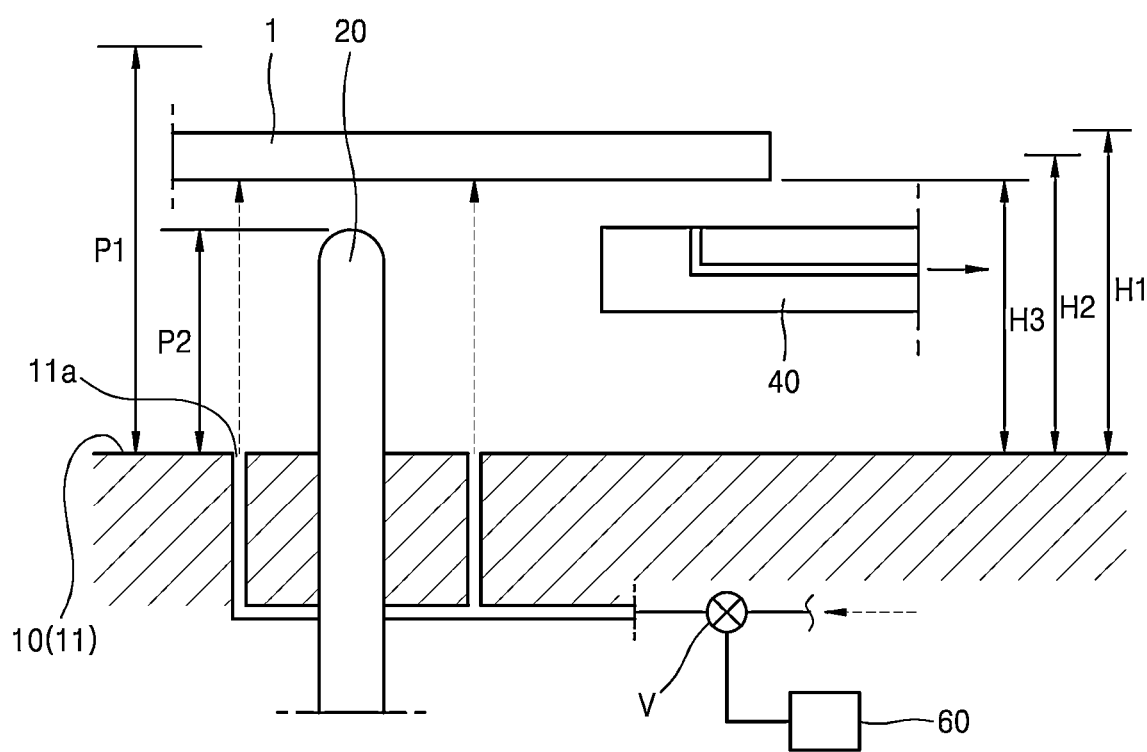

Then, as shown in FIG. 8, if the gripper 40 fails in secondary vacuum suction, the floating height of the floating stage 10 may be controlled to lower the substrate 1 to the third floating height H3 lower than the second floating height H2 by using the floating stage 10.

In this case, if the gripper 40 succeeds in secondary vacuum suction, the floating height of the floating stage 10 may be restored to restore the substrate 1 to the first floating height H1 by using the floating stage 10.

Figure 9:
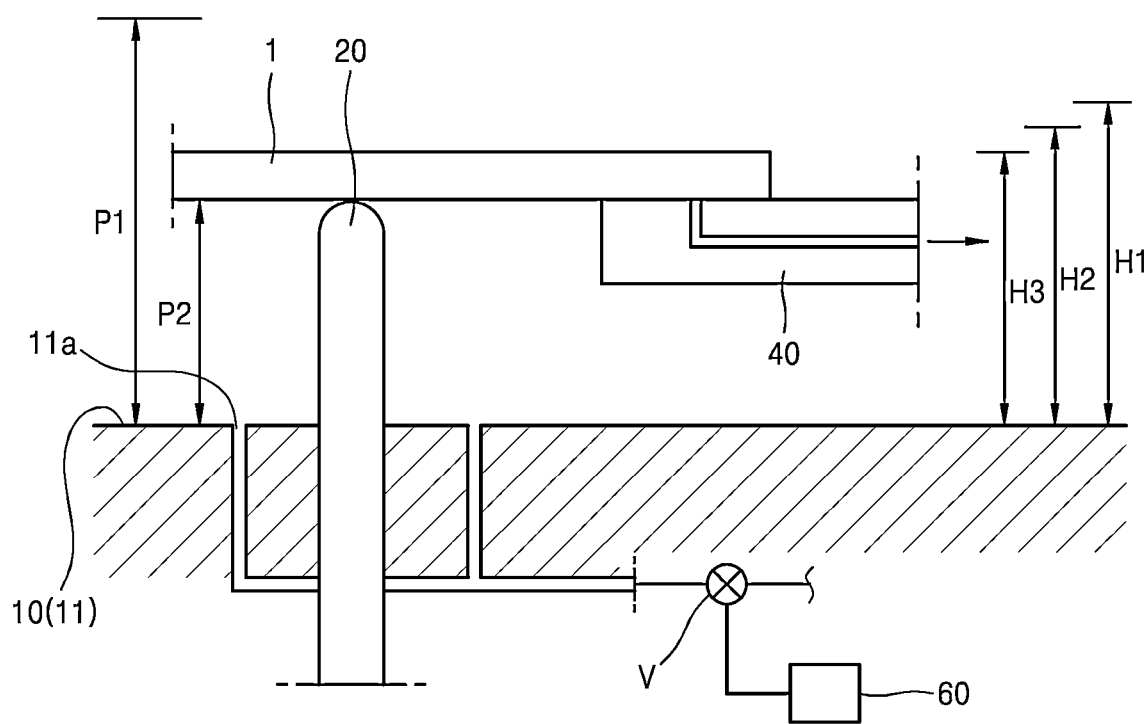

Then, as shown in FIG. 9, if the gripper 40 fails in tertiary vacuum suction, the flow control valve V of the floating stage 10 may be closed such that the substrate 1 is in contact with the gripper 40 without being floated.

Figure 10:
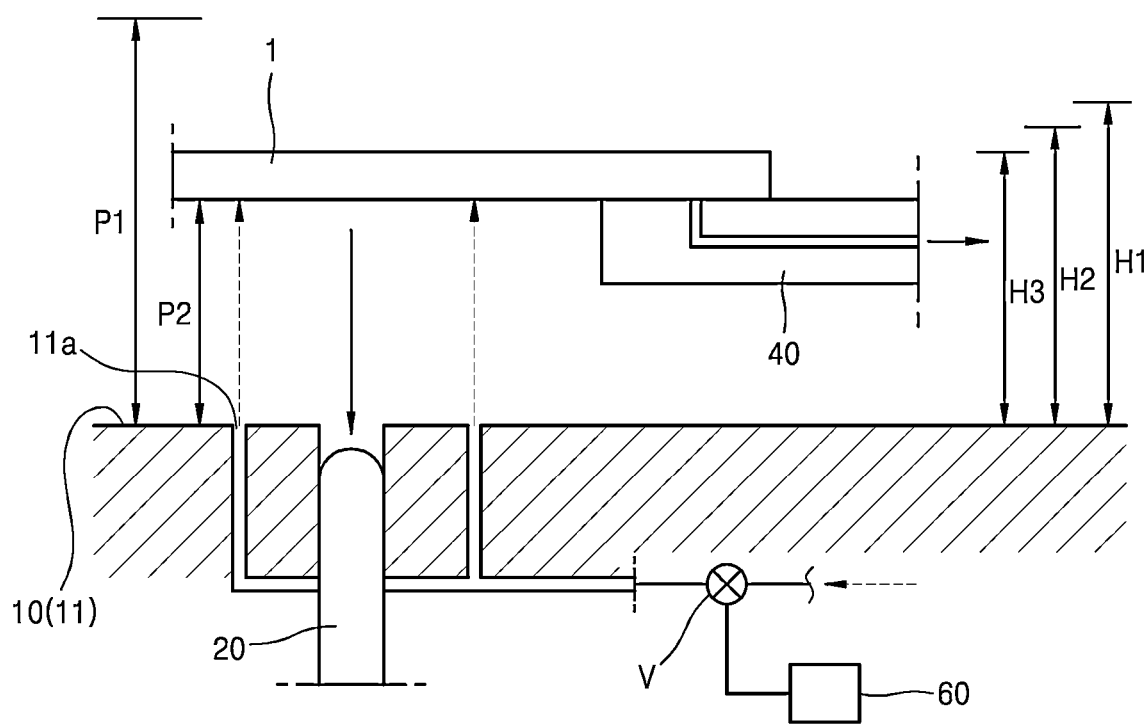

Then, as shown in FIG. 10, when the flow control valve V is closed as described above in relation to FIG. 9, the substrate 1 may be dropped to the gripper 40 by gravity and thus vacuum suction may succeed with a probability of 100%. When the gripper 40 succeeds in vacuum suction as described above, the lift pins 20 may be lowered into the floating stage 10 to transfer the floated substrate 1 in the first direction I by using the gripper 40.

Meanwhile, if the gripper 40 fails in vacuum suction, the substrate processing apparatus 100 according to some embodiments of the present invention may measure the amount of deformation of the substrate 1 by using the substrate deformation measurer S of FIG. 3, and automatically control the floating height of the floating stage 10 to lower the substrate 1 to the automatic floating height lower than the first floating height H1 by using the floating stage 10 based on the measured amount of deformation.

Figure 11:
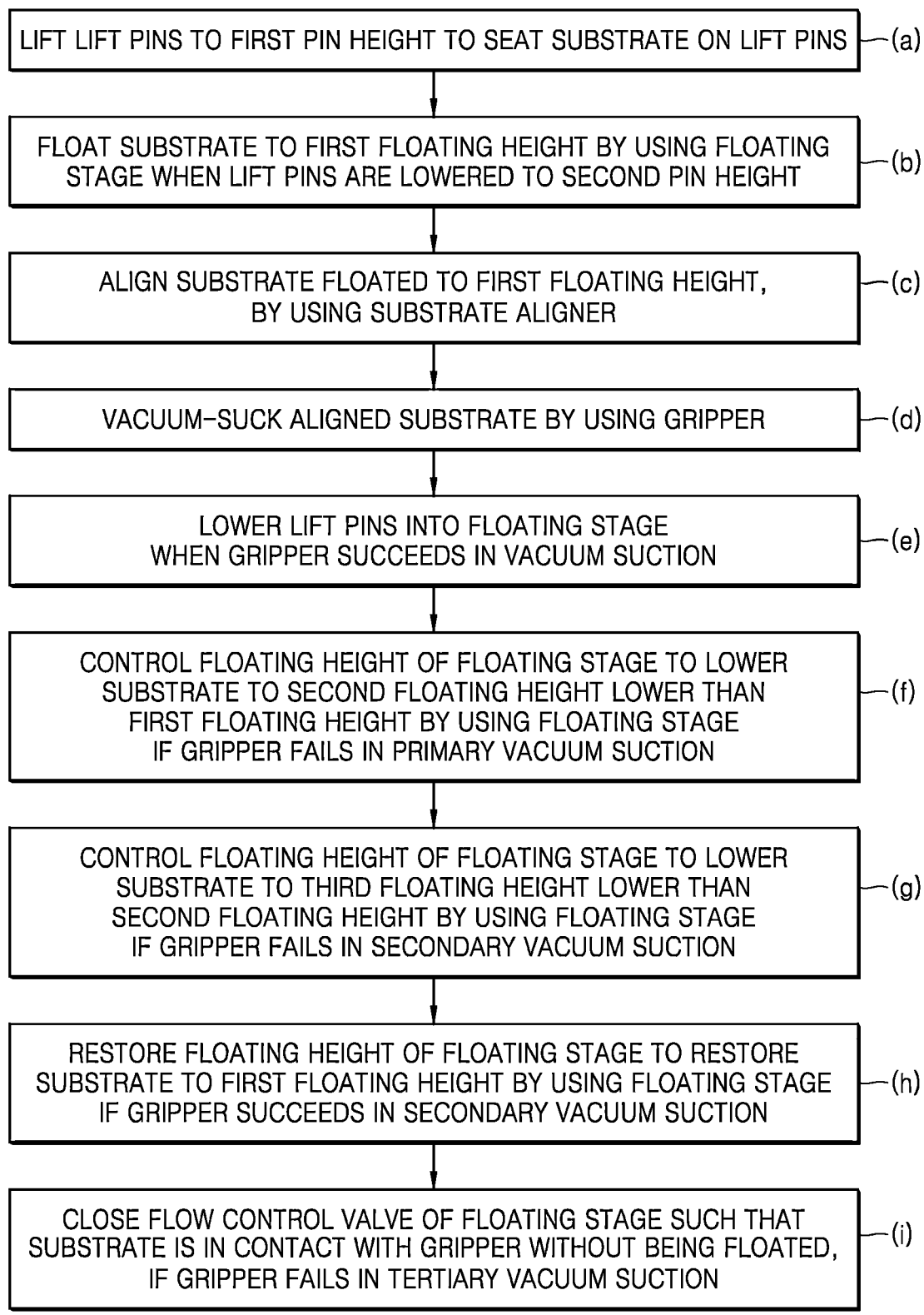
FIG. 11 is a flowchart of a substrate processing method according to some embodiments of the present invention.

FIG. 11 is a flowchart of a substrate processing method according to some embodiments of the present invention.

As shown in FIGS. 1 to 11, the substrate processing method according to some embodiments of the present invention may include (a) lifting the lift pins 20 to the first pin height P1 to seat the substrate 1 on the lift pins 20, (b) floating the substrate 1 to the first floating height H1 by using the floating stage 10 when the lift pins 20 are lowered to the second pin height P2, (c) aligning the substrate 1 floated to the first floating height H1, by using the substrate aligner 30, (d) vacuum-sucking the aligned substrate 1 by using the gripper 40, (e) lowering the lift pins 20 into the floating stage 10 when the gripper 40 succeeds in vacuum suction, (f) controlling the floating height of the floating stage 10 to lower the substrate 1 to the second floating height H2 lower than the first floating height H1 by using the floating stage 10 if the gripper 40 fails in primary vacuum suction, (g) controlling the floating height of the floating stage 10 to lower the substrate 1 to the third floating height H3 lower than the second floating height H2 by using the floating stage 10 if the gripper 40 fails in secondary vacuum suction, (h) restoring the floating height of the floating stage 10 to restore the substrate 1 to the first floating height H1 by using the floating stage 10 if the gripper 40 succeeds in secondary vacuum suction, and (i) closing the flow control valve V of the floating stage 10 such that the substrate 1 is in contact with the gripper 40 without being floated, if the gripper 40 fails in tertiary vacuum suction.

Figure 12:
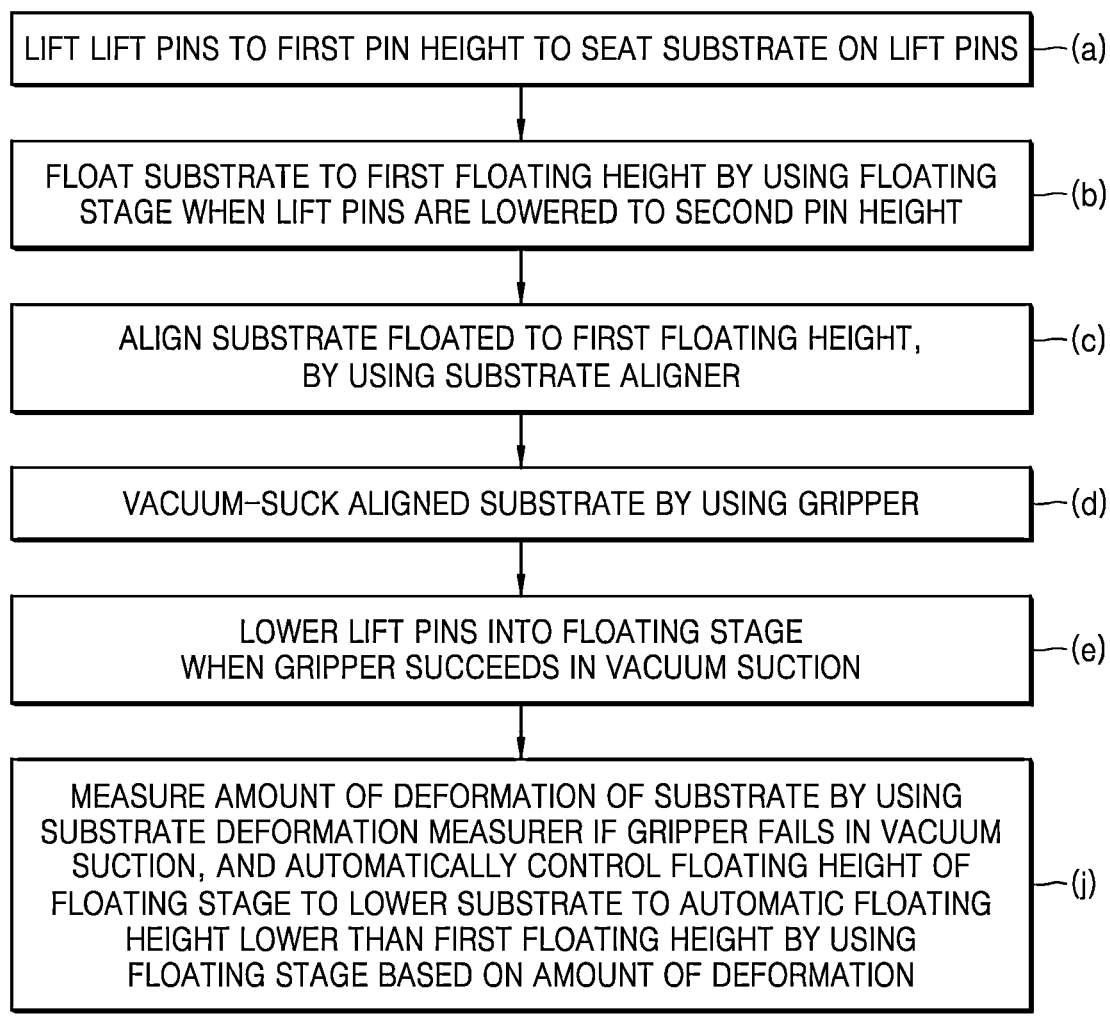
FIG. 12 is a flowchart of a substrate processing method according to other embodiments of the present invention.

FIG. 12 is a flowchart of a substrate processing method according to other embodiments of the present invention.

As shown in FIGS. 1 to 12, the substrate processing method according to other embodiments of the present invention may include (a) lifting the lift pins 20 to the first pin height P1 to seat the substrate 1 on the lift pins 20, (b) floating the substrate 1 to the first floating height H1 by using the floating stage 10 when the lift pins 20 are lowered to the second pin height P2, (c) aligning the substrate 1 floated to the first floating height H1, by using the substrate aligner 30, (d) vacuum-sucking the aligned substrate 1 by using the gripper 40, (e) lowering the lift pins 20 into the floating stage 10 when the gripper 40 succeeds in vacuum suction, and (j) measuring the amount of deformation of the substrate 1 by using the substrate deformation measurer S if the gripper 40 fails in vacuum suction, and automatically controlling the floating height of the floating stage 10 to lower the substrate 1 to the automatic floating height lower than the first floating height H1 by using the floating stage 10 based on the amount of deformation.

Figure 13:
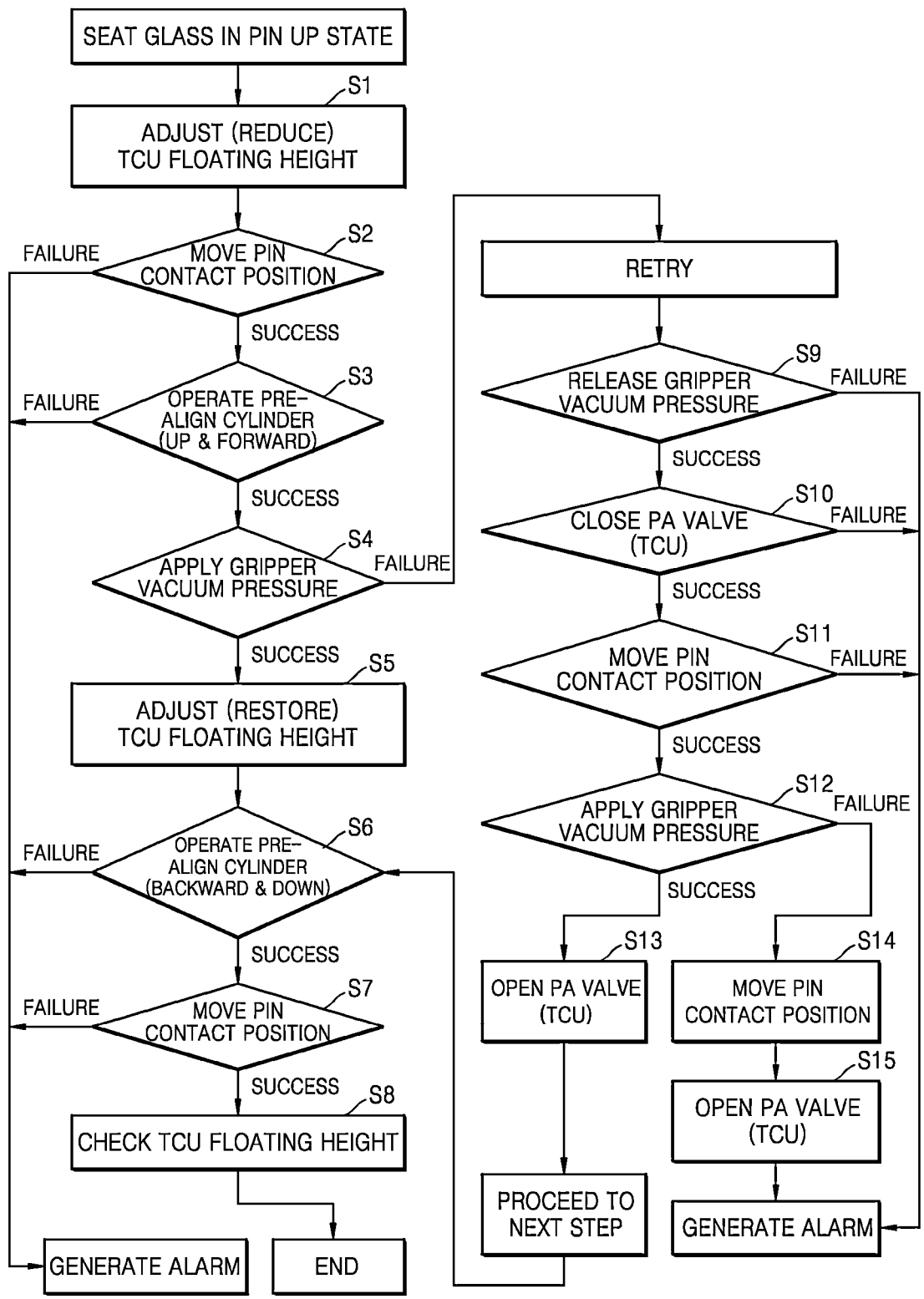
FIG. 13 is a flowchart of a substrate processing method according to other embodiments of the present invention.

FIG. 13 is a flowchart of a substrate processing method according to other embodiments of the present invention.

As shown in FIGS. 1 to 13, in the substrate processing method according to other embodiments of the present invention, initially, when the substrate 1, e.g., a glass substrate, is seated on the lift pins 20 in a pin-up state, a floating height of an air circulation unit of a temperature control unit (TCU), i.e., a gas flow rate or a hydraulic pressure of the gas supply line L1 or the gas suction line L2 of the floating stage 10 may be reduced (S1). When the lift pins 20 are lowered to a pin contact position (S2), the substrate 1 may be pre-aligned by the substrate aligner 30 while being floated by the air circulation unit of the TCU (S3). The air circulation unit of the TCU may include the gas supply line L1 and the gas suction line L2.

Then, a gripper vacuum pressure may be applied (S4) such that the gripper 40 may vacuum-suck the pre-aligned substrate 1. When vacuum suction succeeds, while the gripper 40 is vacuum-sucking at least a portion of the substrate 1, the other portion of the substrate 1 may be floated by adjusting the floating height of the air circulation unit of the TCU (S5), the substrate 1 may be pre-aligned once more by the substrate aligner 30 (S6) while the gripper 40 is vacuum-sucking the substrate 1, the lift pins 20 may be lowered into the floating stage 10 to a pin-down state (S7), and the substrate 1 may be transferred by checking the floating height of the air circulation unit of the TCU (S8).

When the gripper vacuum pressure is applied (S4), if gripping fails, the gripper vacuum pressure may be released (S9), and a flow control valve (e.g., a PA valve) may be partially closed to reduce the floating height of the air circulation unit of the TCU (S10). When the lift pins 20 are lowered to the pin contact position (S11), the gripper vacuum pressure may be applied (S12). When vacuum suction succeeds, the other portion of the substrate 1 may be floated by adjusting the floating height of the air circulation unit of the TCU (S13). When vacuum suction fails, the lift pins 20 may be lowered to the pin contact position (S14), the floating height of the air circulation unit of the TCU may be adjusted (S15), and then an alarm may be generated.

The above-described substrate processing method according to other embodiments of the present invention is not limited to the illustration and may be changed or modified without departing from the scope of the present invention.

According to the afore-described embodiments of the present invention, an equipment downtime and an error correction time may be greatly reduced using a controller and control process for controlling a gripper to always suck a substrate stably even when the substrate is deformed, and thus productivity of equipment may be greatly increased. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A substrate processing apparatus comprising:
a floating stage configured to float a substrate;
lift pins configured to be liftably mounted in the floating stage;
a substrate aligner configured to align the substrate floated from the floating stage;
a gripper configured to vacuum-suck the aligned substrate; and
a controller configured to control a floating height of the substrate,
wherein the controller is configured to float the substrate to a first floating height by using the floating stage, and the controller is configured to lower the substrate to a second floating height lower than the first floating height by using the floating stage, when the gripper fails to vacuum-suck the substrate.

2. The substrate processing apparatus of claim 1, wherein the controller comprises:
a lift pin up controller configured to lift the lift pins to a first pin height to seat the substrate on the lift pins;
a primary floating height controller configured to control a floating height of the floating stage to float the substrate to a first floating height by using the floating stage when the lift pins are lowered to a second pin height;
an alignment controller configured to control the substrate aligner to align the substrate floated to the first floating height;
a vacuum suction controller configured to control the gripper to vacuum-suck the aligned substrate; and
a lift pin down controller configured to lower the lift pins into the floating stage when the gripper succeeds in vacuum suction.

3. The substrate processing apparatus of claim 2, wherein the controller further comprises a secondary floating height controller configured to control the floating height of the floating stage to lower the substrate to a second floating height lower than the first floating height by using the floating stage if the gripper fails in primary vacuum suction.

4. The substrate processing apparatus of claim 3, wherein the controller further comprises a tertiary floating height controller configured to control the floating height of the floating stage to lower the substrate to a third floating height lower than the second floating height by using the floating stage if the gripper fails in secondary vacuum suction.

5. The substrate processing apparatus of claim 3, wherein the controller further comprises a height restoration controller configured to restore the floating height of the floating stage to restore the substrate to the first floating height by using the floating stage if the gripper succeeds in secondary vacuum suction.

6. The substrate processing apparatus of claim 4, wherein the controller further comprises a valve closing controller configured to close a flow control valve of the floating stage such that the substrate is in contact with the gripper without being floated, if the gripper fails in tertiary vacuum suction.

7. The substrate processing apparatus of claim 2, wherein the controller further comprises an automatic floating height controller configured to measure an amount of deformation of the substrate by using a substrate deformation measurer if the gripper fails in primary vacuum suction, and configured to automatically control the floating height of the floating stage to lower the substrate to an automatic floating height lower than the first floating height by using the floating stage based on the amount of deformation.

8. The substrate processing apparatus of claim 1, further comprising a treatment liquid ejector configured to eject a treatment liquid onto the substrate, at least a portion of which is vacuum-sucked by the gripper and at least another portion of which is floated by the floating stage.

9. The substrate processing apparatus of claim 8, wherein the floating stage comprises:
a loading stage configured to load the substrate, floating the substrate to a transfer height, and transferring the substrate in a first direction; and
a printing stage configured to float the substrate to a printing height to allow the treatment liquid ejector to eject the treatment liquid while moving in a first direction or a second direction.

10. The substrate processing apparatus of claim 9, wherein
the loading stage comprises a plurality of gas emission holes connected to a gas supply line, and
the printing stage comprises a plurality of gas emission holes connected to the gas supply line and a plurality of gas suction holes connected to a gas suction line.

11. The substrate processing apparatus of claim 10, wherein the controller is configured adjust a gas supply pressure by controlling a flow control valve of the gas supply line or the gas suction line.

12. The substrate processing apparatus of claim 9, wherein the floating stage further comprises an unloading stage configured to float the substrate to a transfer height, transfer the substrate in the first direction, and unload the substrate.

13. The substrate processing apparatus of claim 1, further comprising:
a substrate deformation measurer configured to measure an amount of deformation of the substrate and apply information about the amount of deformation to the controller.

14. The substrate processing apparatus of claim 1, wherein the gripper is configured to be transferred along transfer rails provided along the floating stage.

15. A substrate processing method comprising:
(a) lifting lift pins to a first pin height to seat a substrate on the lift pins;
(b) floating the substrate to a first floating height by using a floating stage when the lift pins are lowered to a second pin height;
(c) aligning the substrate floated to the first floating height, by using a substrate aligner;
(d) vacuum-sucking the aligned substrate by using a gripper;
(e) lowering the lift pins into the floating stage when the gripper succeeds in vacuum suction; and
(f) controlling a floating height of the floating stage to lower the substrate to a second floating height lower than the first floating height by using the floating stage if the gripper fails in primary vacuum suction.

16. The substrate processing method of claim 15, further comprising, after step (f), (g) controlling the floating height of the floating stage to lower the substrate to a third floating height lower than the second floating height by using the floating stage if the gripper fails in secondary vacuum suction.

17. The substrate processing method of claim 16, further comprising, after step (f), (h) restoring the floating height of the floating stage to restore the substrate to the first floating height by using the floating stage if the gripper succeeds in secondary vacuum suction.

18. The substrate processing method of claim 16, further comprising, after step (g), (i) closing a flow control valve of the floating stage such that the substrate is in contact with the gripper without being floated, if the gripper fails in tertiary vacuum suction.

19. The substrate processing method of claim 15, wherein step (f) comprises (j) measuring an amount of deformation of the substrate by using a substrate deformation measurer if the gripper fails in vacuum suction, and automatically controlling the floating height of the floating stage to lower the substrate to an automatic floating height lower than the first floating height by using the floating stage based on the amount of deformation.

20. A substrate processing apparatus comprising:
a floating stage configured to float a substrate;
lift pins configured to be liftably mounted in the floating stage;
a substrate aligner configured to align the substrate floated from the floating stage;
a gripper configured to vacuum-such the aligned substrate;
a treatment liquid ejector configured to eject a treatment liquid onto the substrate; and
a controller configured to control a floating height of the substrate,
wherein, to reduce the floating height of the substrate when the gripper fails to vacuum-suck the substrate, the controller includes
a lift pin up controller for lifting the lift pins to a first pin height to seat the substrate on the lift pins;
a primary floating height controller configured to control a floating height of the floating stage to float the substrate to a first floating height by using the floating stage when the lift pins are lowered to a second pin height;
an alignment controller configured to control the substrate aligner to align the substrate floated to the first floating height;
a vacuum suction controller configured to control the gripper to vacuum-suck the aligned substrate;
a lift pin down controller configured to lower the lift pins into the floating stage when the gripper succeeds in vacuum suction; and
a secondary floating height controller configured to control the floating height of the floating stage to lower the substrate to a second floating height lower than the first floating height by using the floating stage if the gripper fails in primary vacuum suction.

* * * * *